United States Patent [19]
Wu

[11] Patent Number: 6,133,118
[45] Date of Patent: *Oct. 17, 2000

[54] EDGE POLYSILICON BUFFER LOCOS ISOLATION

[75] Inventor: Shye-Lin Wu, Hsinchu, Taiwan

[73] Assignee: Acer Semiconductor Manufacturing Inc., Hsinchu, Taiwan

[*] Notice: This patent is subject to a terminal disclaimer.

[21] Appl. No.: 09/138,298

[22] Filed: Aug. 21, 1998

[30] Foreign Application Priority Data

Aug. 22, 1997 [TW] Taiwan ................................. 86112280

[51] Int. Cl.⁷ ..................................................... H01L 21/76
[52] U.S. Cl. .............................................................. 438/448
[58] Field of Search ..................... 438/439, 446, 438/448, 450

[56] References Cited

U.S. PATENT DOCUMENTS

| | | | |
|---|---|---|---|
| 5,175,123 | 12/1992 | Vaquez et al. ........................ | 438/448 |
| 5,254,494 | 10/1993 | Van Der Plas et al. ............... | 438/448 |
| 5,393,692 | 2/1995 | Wu ....................................... | 438/446 |
| 5,563,091 | 10/1996 | Lee ....................................... | 438/450 |
| 5,612,248 | 3/1997 | Jeng ..................................... | 438/448 |
| 5,679,601 | 10/1997 | Wu ....................................... | 438/446 |

*Primary Examiner*—Donald L. Monin, Jr.
*Assistant Examiner*—Anh Duy Mai
*Attorney, Agent, or Firm*—Harness, Dickey & Pierce, P.L.C.

[57] ABSTRACT

The present invention discloses an isolation method for fabricating isolation regions with less bird's peak sizes in semiconductor devices. A first pad oxide layer and a silicon nitride layer are first formed on a wafer substrate. After an undercut process is performed to the first pad oxide layer and forms a cave under the silicon nitride layer, a second pad oxide layer is formed over the wafer substrate. Next, a polysilicon layer is then deposited along the profile described above. Then, an anisotropic process is used to form sidewall spacers by etching the polysilicon layer. A recessed structure is then formed to the wafer substrate by a semi-isotropic process, and follows a thermal oxidation to fabricate isolation regions composed of silicon dioxide on the surface of the wafer substrate. The silicon nitride layer and the first pad oxide layer are then removed for continuing the active region processes.

20 Claims, 4 Drawing Sheets

EDGE POLYSILICON BUFFER LOCOS ISOLATION

BACKGROUND OF THE INVENTION

1. Field of the Invention

The invention relates to a method for fabricating isolation regions in semiconductor devices, and more particularly, to a method for reducing stress between the nitride and poly layers and the dimension of the bird's beak without necessitating the removal of the polysilicon buffer layer.

2. Description of the Prior Art

Isolation regions among semiconductor devices that prevent the individual device from operation interference by others have become a very important technique, especially given the increases of the packing densities of semiconductor devices. One common isolation scheme is to apply a local oxidation of silicon (LOCOS) process to fabricate such isolation regions. Typically, the LOCOS process utilizes the property of oxygen diffusion through $Si_3N_4$ (silicon nitride) that is patterned on the substrate to form field oxide regions. Accordingly, oxide thermally grows at the substrate surface that is not covered by the silicon nitride.

Basically, the isolation regions formed by the conventional LOCOS process usually suffers from bird's beak, which is a lateral extension of the field oxide (isolation region) into the active area of the semiconductor device. Some disadvantages of the LOCOS process made itself unsuitable for deep sub-micro technologies. Except for the aforementioned bird's beak, non-planarization, oxide field-thinning effect, and stress-induced defects still remain problems which need to be overcome. New isolation schemes are thus sequentially suggested to overcome the disadvantages of the LOCOS process. For example, poly-buffered LOCOS (PBL or PBLOCOS) is a widely adopted LOCOS-based process that substantially reduces the dimension of the undesirable bird's beak.

Unfortunately, the PBL approach still suffers from pit problems induced by voids that occur in the polysilicon layer during field oxide growth. It is proposed that the voids arise from stress between the nitride and poly layers. On the other hand, no matter the LOCOS-based schemes are modified, it seems difficult to reduce the bird's beak length to much less than 0.1 micro-meter. Another isolation technology, the shallow-trench isolation process, is thus disclosed for sub-quarter-micro-meter technology. Generally, dry etching is performed to anisotropically etch the substrate by using a sacrificial photoresist layer as mask. Next, when a chemical-vapor-deposition (CVD) oxide layer is deposited on the substrate surface, an etching back process is performed to leave only the top surface at the same level as the original substrate. Obviously, neither bird's beak nor encroachment is obtained in the isolation region.

Although the shallow-trench isolation brings advantages that are insufficient in the LOCOS-based process, the shallow-trench isolation is nevertheless a more complicated process than all of the LOCOS-based methods. Accordingly, the shallow-trench isolation has not been broadly used in industry. Some articles are consecutively disclosed to suggest methods for overcoming the aforementioned disadvantages of the LOCOS-based processes. For example, an article titled "Characteristics of CMOS device isolation for the ULSI age" (referring to IDEM p. 679, 1994) disclosed by Bryant et al. suggests a method for overcoming the problem between the LOCOS and the shallow trench isolation processes to achieve a scaling requirement. Nagal et al. disclose in an article titled "Stress-induced void formation in inter-level polysilicon films during polybuffered local oxidation of silicon" in J. of Electrochem (vol. 140, p. 2356, 1993) a method that eliminates the pit problem of the polysilicon buffer layer after a wet etching is performed. It is obvious that current isolation schemes have not as yet achieved the requirements of the semiconductor devices. A need has arisen to disclose an isolation method for improving known isolation methods, and furthermore, to overcome the disadvantages of conventional skills.

SUMMARY OF THE INVENTION

Accordingly, the present invention discloses a method of fabricating isolation regions in semiconductor devices. A first pad oxide layer and a silicon nitride layer are first formed on a wafer substrate. After an undercut process is performed to the first pad oxide layer and forms a cave under the silicon nitride layer, a second pad oxide layer is formed over the wafer substrate. Next, a polysilicon layer is then deposited along the profile described above. Then, an anisotropic etching process is used to form sidewall spacers by etching the polysilicon layer. A recessed structure is then formed to the wafer substrate by a semi-isotropic process, and a high temperature thermal oxidation process is used to fabricate isolation regions composed of silicon dioxide on the surface of the wafer substrate. The silicon nitride layer and the first pad oxide layer are then removed for continuing the active region processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
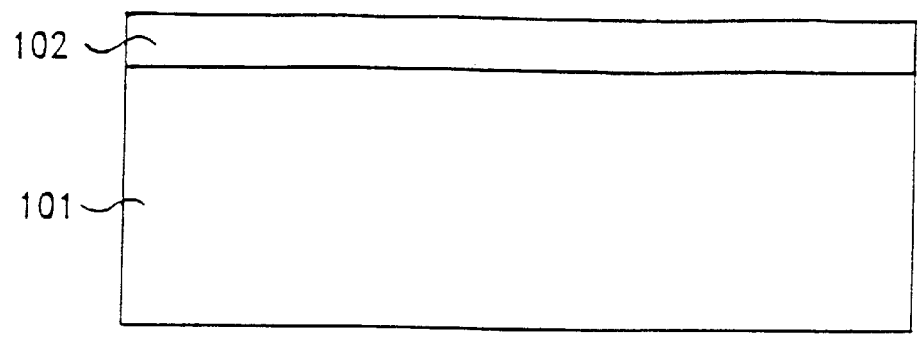
FIG. 1 is a cross-sectional view of a wafer substrate when a first pad oxide is formed.
Figure 2:
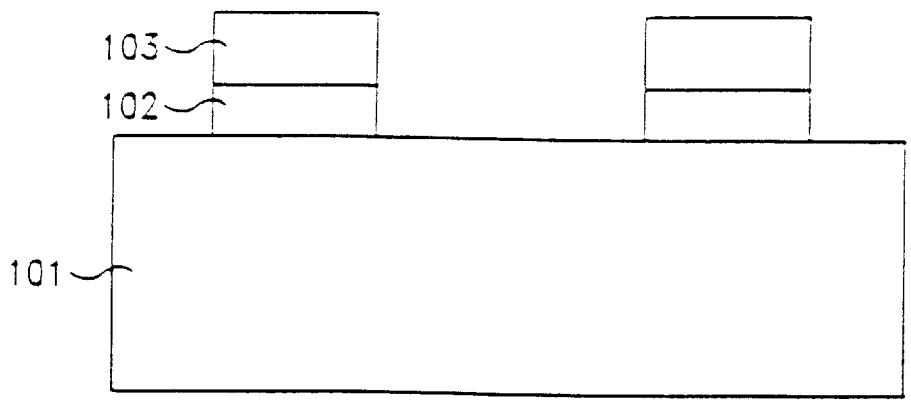
FIG. 2 is a cross-sectional view of the wafer substrate when a silicon nitride layer is formed on the first pad oxide layer.
Figure 3:
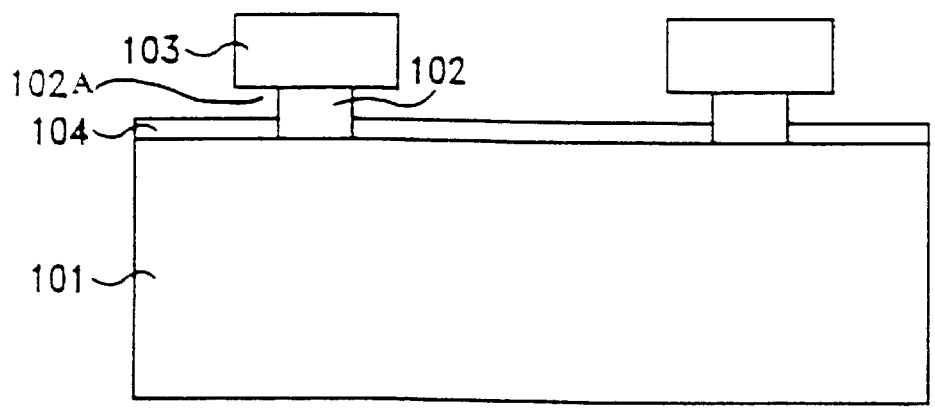
FIG. 3 is a cross-sectional view of the wafer substrate when an undercut process is performed for the silicon nitride layer and a second pad oxide layer is performed thereafter.

FIG. 1 represents a cross-section illustrative of a first pad oxide layer 102 formed on the wafer substrate 101 by thermal oxidation in oxygen. The first pad oxide layer 102 is composed of silicon dioxide with a thickness of about 30 to 600 Å (angstroms). A silicon nitride layer 103 with a thickness of about 500 to 3000 Å is then formed to cover the active region, wherein FIG. 2 represents the cross section illustrating the silicon nitride layer 103 formed and patterned. Then, a buffered-oxide etching (BOE) or HF solution is applied to undercut the first pad oxide layer. Finally, a cavity 102A is formed at the bottom of the silicon nitride layer 103, and the depth of cavity 102A relates to etching time. Next, a second pad oxide layer 104 is formed on the wafer substrate 101 by thermal oxidation in oxygen again, wherein the composition of the second pad oxide is also silicon dioxide. Please note that the second pad oxide could be composed of silicon oxy-nitride when it was grown by thermal oxidation in $N_2O$ or NO. FIG. 3 shows the cross-sectional view after the second pad oxide layer 104 is formed. The thickness of the second pad oxide layer 104 is about 20 to 200Å.

Figure 4:
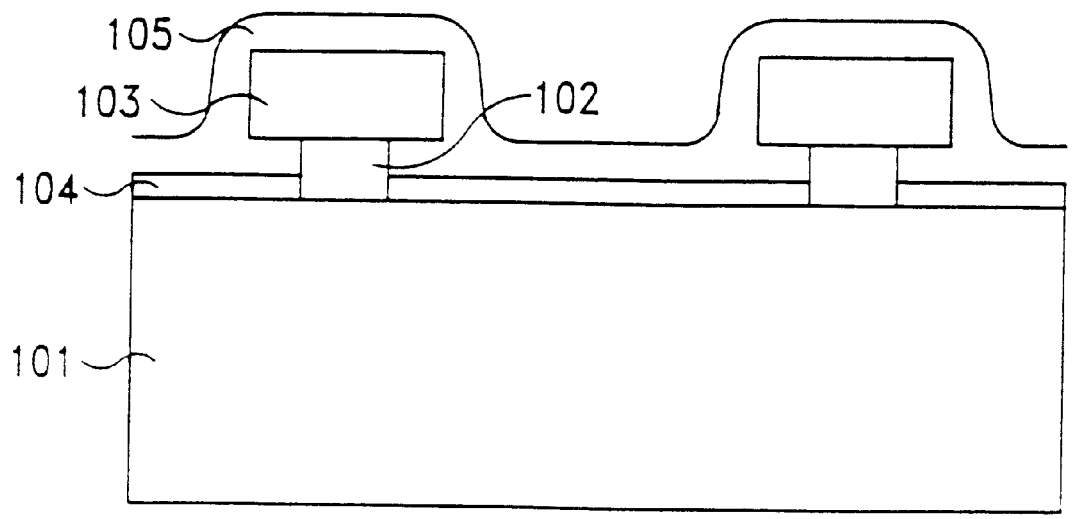
FIG. 4 represents a cross-section illustrative of a polysilicon layer deposited along the profile of FIG. 3.
Figure 5:
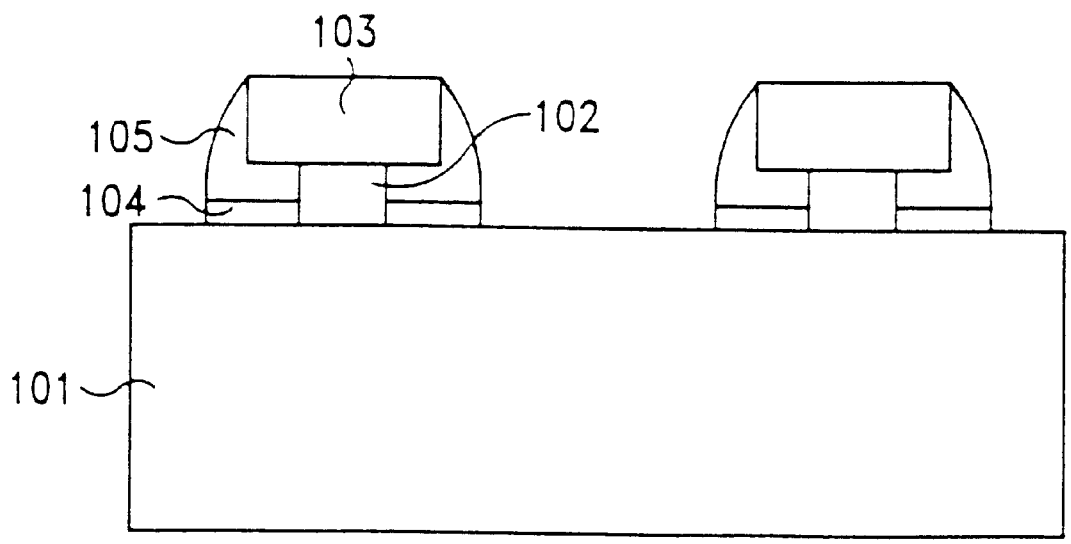
FIG. 5 illustrates a cross-section representative of an anisotropic etch process performed to fabricate sidewall spacers in the FIG. 4.

FIG. 4 illustrates cross-sectional view representative of a polysilicon layer 105 formed along the profile described in FIG. 3. The polysilicon layer 105 can be deposited by using a CVD (chemical vapor deposition) process to grow a thickness of about 50 to 1000 Å. Please note that the polysilicon layer 105 will cover the silicon nitride layer 103 and the second pad oxide layer 104, and furthermore, will fill the cavity 102A under the silicon nitride layer 103. Next, an anisotropic etch process is used to etch the polysilicon layer 105. The cross-section in FIG. 5 describes the polysilicon layer 105 having been completely etched. As noted, the polysilicon layer 105 is etched to form sidewall spacers on the sides of the first pad oxide layer the top of 102, the second pad oxide layer 104, and the sides of the silicon nitride layer 103. The thickness of the sidewall spacer is about 100 to 1000 Å. Moreover, the anisotropic etch method mentioned above can apply $SiCl_4/Cl_2$, $BCl_3/Cl_2$, $HBr/Cl_2/O_2$, $HBr/O_2$, $Br_2/SF_6$, or $SF_6$ as reaction gas to etch the polysilicon layer 105.

Figure 6:
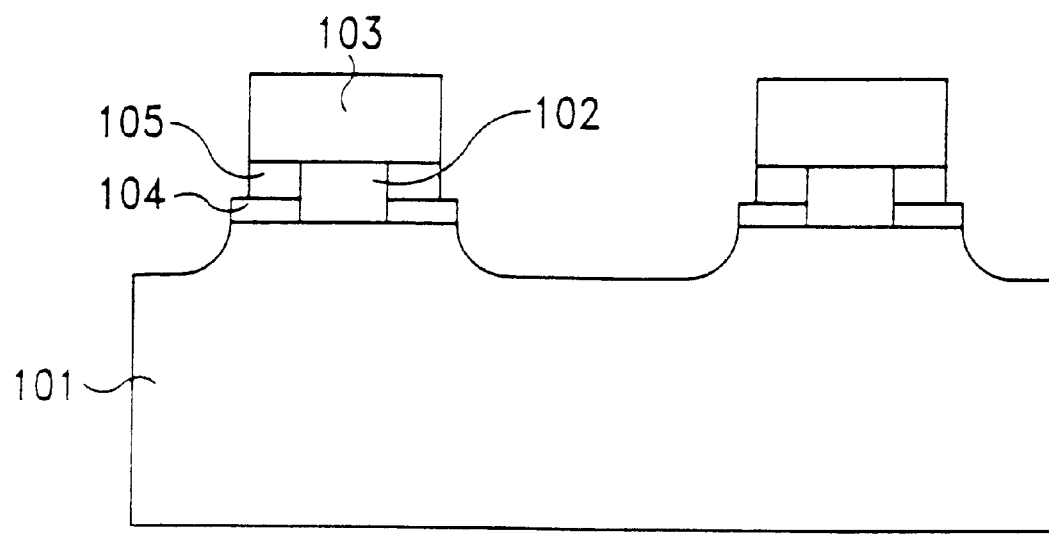
FIG. 6 shows a cross-section of the wafer silicon after a semi-isotropic etching process is performed.

A recessed structure is then obtained by applying a semi-isotropic scheme to etch the wafer substrate 101 by using the first pad oxide layer 102, the silicon nitride layer 103 and the second pad oxide layer 104 as masks. Finally, the silicon of wafer substrate 101 is stripped except for those regions covered by the first pad oxide layer 102, the silicon nitride layer 103 and the second pad oxide layer 104. The depth of the recessed structure is about 100 to 1500 Å, and FIG. 6 is the cross-sectional view after the recessed structure has been completely fabricated. Please note that the sidewall spacers (e.g., the polysilicon layer 105) is used as a polysilicon buffer layer to avoid too many defects caused from performing the semi-isotropic etch. In addition, the second pad oxide layer 104 will be partially etched when the semi-isotropic etch is performed, and the length 104A of the second pad oxide layer 104 after performing the semi-isotropic process is about 100 to 1000 Å.

Figure 7:
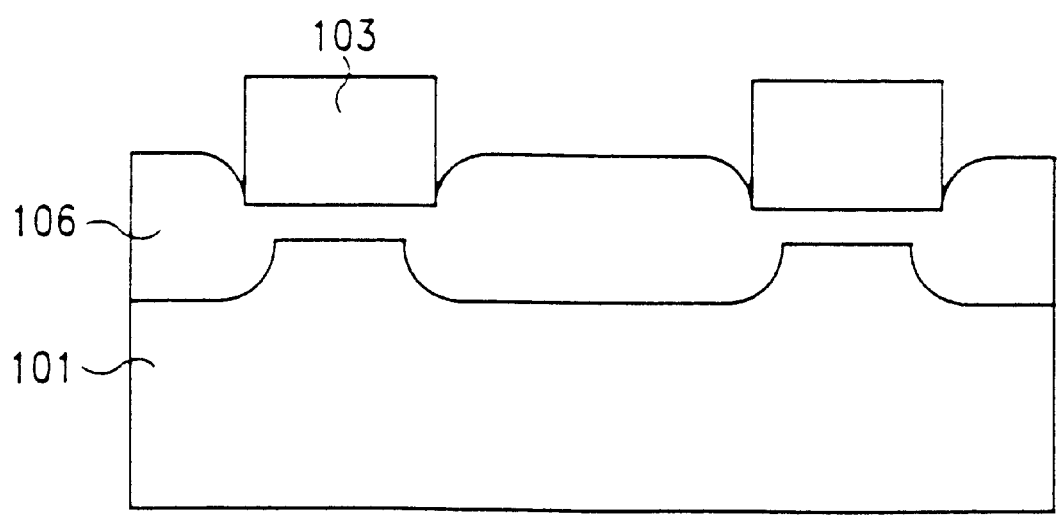
FIG. 7 depicts a cross-sectional view of the wafer substrate when a thermal oxidation process is performed to fabricate isolation regions on the wafer substrate.
Figure 8:
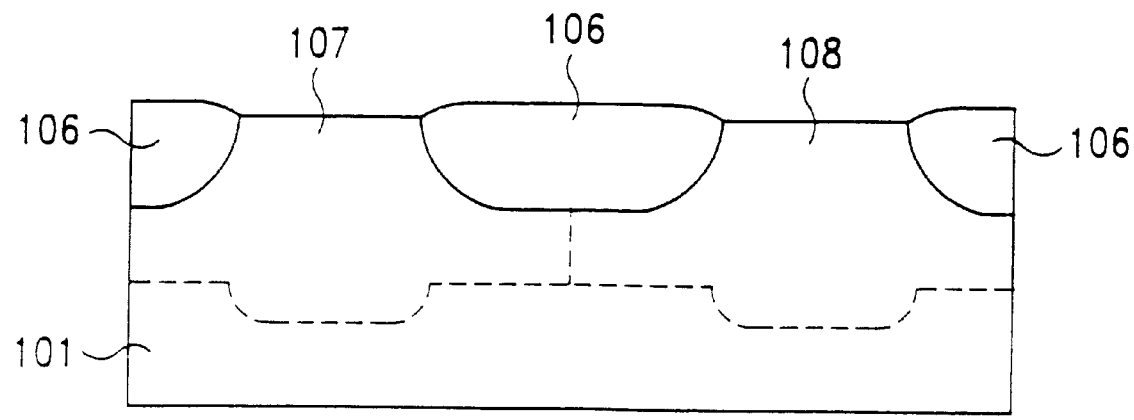
FIG. 8 is a cross-sectional view illustrative of removing the silicon nitride and the silicon dioxide from the active region.

Referring to FIG. 7, which represents a cross-sectional view of when a thermal oxidation is performed to the wafer substrate 101 in the FIG. 6 to grow a silicon dioxide layer 106. The purpose of forming the silicon dioxide layer 106 is to fabricate isolation regions in the semiconductor device. Because the remaining polysilicon layer 105 is composed of silicon, it will be oxidized to become silicon dioxide, too. Therefore, the oxidized polysilicon layer 105 and the second pad oxide layer 104 will connect with the first pad oxide later 102. Please note that the edge of the buffer polysilicon layer 105 is oxidized, this it is unnecessary to remove the edge of the buffer polysilicon layer 105 as the conventional schemes do. Accordingly, the encroachment of the active region and the stress between the nitride and the polysilicon will be significantly released, and the voids/pit problem is also eliminated (please refer to "Stress-induced Void Formation in Interlevel Polysilicon Films During Polybuffered Local Oxidation of Silicon" by Nagel et al., in J. of Electrochem., vol. 140, p. 2356, 1993). FIG. 7 represents the cross-section after the polysilicon layer 105 is completely oxidized. In addition, the isolation regions have a larger thicker field oxide into the wafer substrate 101 because the wafer substrate 101 has formed a recessed structure. Furthermore, because the second pad oxide layer 104 is oxidized to be silicon dioxide, the bird's beak length will be significantly shorter than the one generated by the conventional LOCOS and PBL approaches. Clearly, the leakage current of the proposed isolation is less than the traditional LOCOS-based schemes.

Processes of forming the active regions can be performed when the silicon nitride layer 103 and the silicon dioxide layer 106 are removed. A hot $H_3PO_4$ solution is applied to strip the silicon nitride layer 103, and the silicon dioxide layer 106 can be removed by using a BOE or HF solution. Please note that the isolation regions will be simultaneously stripped when the silicon dioxide layer 106 is removed thus decreasing the height of the isolation regions, and the surface of the wafer substrate 101 is smoother.

Figure 9:
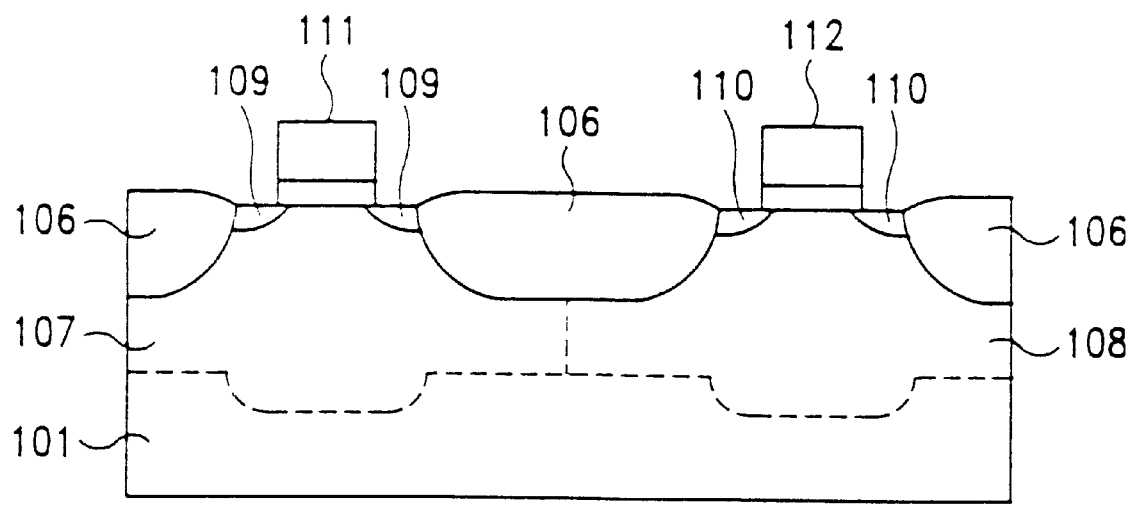
FIG. 9 is a cross-sectional view illustrative of fabricating a CMOS device on the active region.

FIG. 9 shows a cross-section representative of a CMOS (Complementary Metal-Oxide-Semiconductor) transistor after a main process has been done. Ion implantation is applied to fabricate a source and a drain 109 against the side of the gate 111 in the P-well 107, and a source and a drain 110 is fabricated against the side of the gate 112 in the N-well 108.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A method for fabricating an isolation region in a substrate, said method comprising the steps of:

forming a first pad oxide layer on said substrate;

forming a silicon nitride layer on said first pad oxide layer;

etching said first pad oxide layer to form a cave in said first pad oxide layer, said cave being at a bottom of said silicon nitride layer;

forming a second pad oxide layer on said substrate;

depositing a polysilicon layer over said substrate, said polysilicon layer filling said cave of said first pad oxide layer;

forming a sidewall spacer against sides of said first pad oxide layer, said silicon nitride layer, said second pad oxide layer;

forming a recessed structure on said substrate by using said first pad oxide layer, said silicon nitride layer, said second pad oxide layer as masks;

forming said isolation region in said recessed structure;

removing said silicon nitride layer; and removing said first pad oxide layer.

2. The method according to claim 1, wherein said cave of said first pad oxide layer is formed by undercutting.

3. The method according to claim 1, wherein a depth of said cave of said first pad oxide layer is concerned with etching time.

4. The method according to claim 1, wherein a thickness of said second pad oxide layer is about 20 to 200 Å.

5. The method according to claim 1, wherein said second pad oxide layer is formed along sides of said first pad oxide layer.

6. The method according to claim 1, wherein a thickness of said spacer layer is about 100 to 1000 Å.

7. The method according to claim 1, wherein said sidewall spacer is formed by using anisotropic etch.

8. The method according to claim 7, wherein parts of said second pad oxide layer are removed after forming said spacer layer.

9. The method according to claim 8, wherein a thickness of said second pad oxide layer against said first pad oxide layer is about 20 to 200 Å.

10. The method according to claim 1, wherein said depth of said recessed structure is about 200 to 1500 Å.

11. The method according to claim 1, wherein said recessed structure is formed by using semi-isotropic etching.

12. The method according to claim 1, wherein parts of said isolation region is removed when said first pad oxide layer is removed.

13. A method for fabricating an isolation region in a substrate, said method comprising the steps of:

forming a first pad oxide layer on said substrate;

forming a silicon nitride layer on said first pad oxide layer;

etching said first pad oxide layer to form a cave in said first pad oxide layer and at a bottom of said silicon nitride layer, a depth of said cave is concerned with etching time;

forming a second pad oxide layer on said substrate, said second pad oxide layer is formed along sides of said first pad oxide layer;

depositing a polysilicon layer over said substrate, said polysilicon layer fill said cave of said first pad oxide layer;

forming a sidewall spacer against sides of said first pad oxide layer, said silicon nitride layer, said second pad oxide layer by using anisotropic etch;

forming a recessed structure on said substrate by using said first pad oxide layer, said silicon nitride layer, said second pad oxide layer as masks;

forming said isolation region in said recessed structure by using thermal oxidation;

removing said silicon nitride layer; and removing said first pad oxide layer, parts of said isolation region is removed when said first pad oxide layer is removed.

14. The method according to claim 13, wherein said cave of said first pad oxide layer is formed by undercutting.

15. The method according to claim 13, wherein a thickness of said second pad oxide layer is about 20 to 200 Å.

16. The method according to claim 13, wherein a thickness of said sidewall spacer is about 100 to 1000 Å.

17. The method according to claim 13, wherein parts of said second pad oxide layer is removed when forming said spacer layer.

18. The method according to claim 17, wherein a thickness of said second pad oxide layer against said first pad oxide layer is about 100 to 1000 Å.

19. The method according to claim 13, wherein said depth of said recessed structure is about 200 to 1500 Å.

20. The method according to claim 13, wherein said recessed structure is formed by using semi-isotropic etching.

* * * * *